United States Patent

Kim

[11] Patent Number: 5,859,671
[45] Date of Patent: Jan. 12, 1999

[54] SYMBOL TIMING RECOVERY CIRCUIT AND METHOD

[75] Inventor: Ki-Bum Kim, Seoul, Rep. of Korea

[73] Assignee: Samsung Electronics Co., Ltd., Kyungki-do, Rep. of Korea

[21] Appl. No.: 750,014

[22] PCT Filed: Jun. 5, 1996

[86] PCT No.: PCT/KR96/00085

§ 371 Date: May 7, 1997

§ 102(e) Date: May 7, 1997

[87] PCT Pub. No.: WO96/42170

PCT Pub. Date: Dec. 27, 1996

[30] Foreign Application Priority Data

Jun. 9, 1995 [KR] Rep. of Korea ............... 1995/15219

[51] Int. Cl.[6] ..................................... H04N 5/12
[52] U.S. Cl. ................... 348/537; 348/500; 375/355
[58] Field of Search .................... 348/537, 536, 348/500, 540, 525, 530, 531, 526, 527, 528, 529, 532, 533, 534, 535, 725, 726; 375/326, 355, 371; H04N 5/12

[56] References Cited

U.S. PATENT DOCUMENTS

| 4,805,191 | 2/1989 | Burch et al. ................................ 375/11 |
| 4,815,103 | 3/1989 | Cupo et al. ............................... 375/355 |
| 5,285,482 | 2/1994 | Seheir et al. ............................. 375/355 |
| 5,369,668 | 11/1994 | Yamamoto ................................ 375/14 |
| 5,388,127 | 2/1995 | Scarpa ..................................... 375/120 |
| 5,565,932 | 10/1996 | Citta et al. ............................... 346/678 |
| 5,572,249 | 11/1996 | Ghoxh ..................................... 348/725 |
| 5,594,506 | 1/1997 | Yang ....................................... 348/531 |

*Primary Examiner*—Chris Grant
*Attorney, Agent, or Firm*—Sughrue, Mion, Zinn, Macpeack & Seas, PLLC

[57] ABSTRACT

A symbol timing recovery circuit and method of a digital television is disclosed including: an analog-to-digital converter (10) for sampling a received analog signal by a symbol clock to be converted to digital data; demodulator (20) for recovering a carrier wave, demodulating the digital data to a baseband signal and generating a segment signal; a segment synchronizing signal detector (40) for detecting a segment synchronizing signal from the segment signal; a phase error detector (50) activated by the segment synchronizing signal, for receiving the segment signal and detecting a phase error of synchronizing symbols of the segment synchronizing signal; and a symbol clock is phase adjuster (60) for adjusting the phase of the symbol clock according to the phase error of the synchronizing symbols to be supplied to the analog-to-digital converter as the symbol clock.

9 Claims, 4 Drawing Sheets

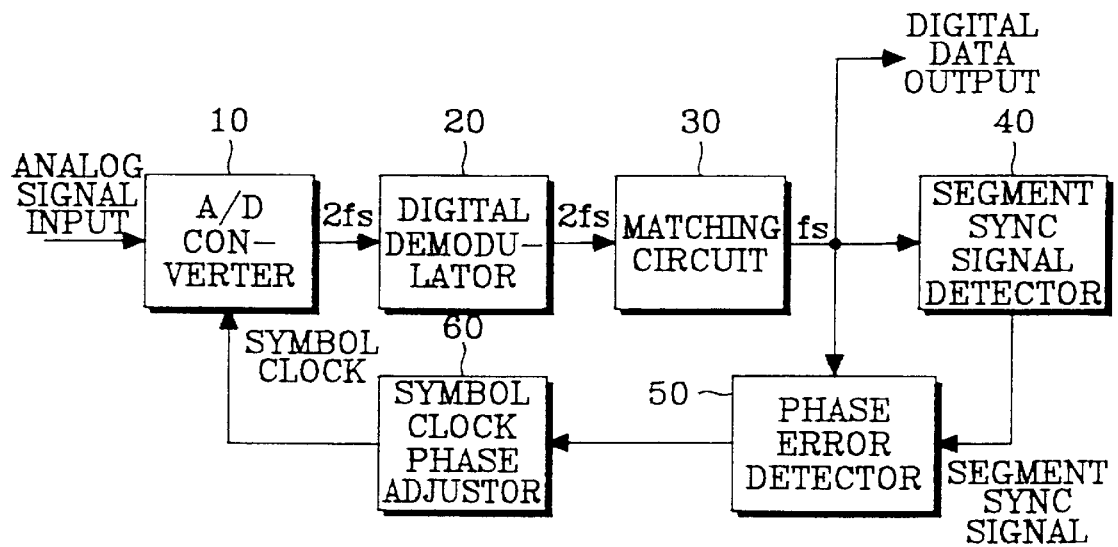
Fig. 1
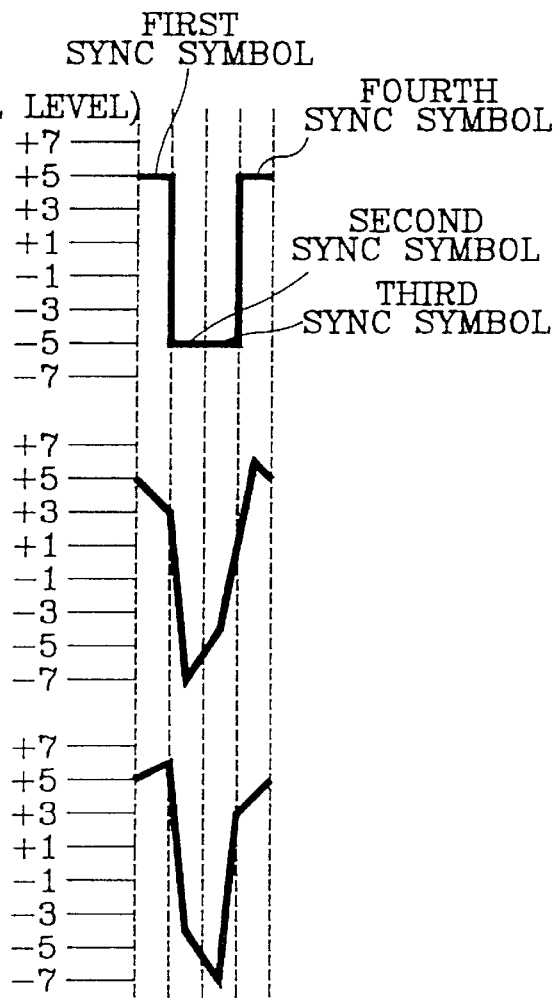
Fig. 2A
Fig. 2B
Fig. 2C

SYMBOL TIMING RECOVERY CIRCUIT AND METHOD

TECHNICAL FIELD

The present invention relates to a digital television receiver, and more particularly to a circuit and method for recovering a symbol timing in order to accurately demodulate transmission signals.

BACKGROUND ART

Digital receivers should use a demodulator synchronized with the symbol transition of an input digital signal for optimal demodulation. Since the receiver including a channel equalizer is usually operated by a digital circuit, a received analog signal can be converted to a digital signal through an analog-to-digital converter at an accurate sampling time. That is, since a signal processing operation is carried out after the analog signal is converted to the digital signal, the digital receiver can implement a normal operation when data is accurately generated at the sampling time.

In digital high picture quality television systems, the GA (Grand Alliance) system uses, as a carrier wave, a pilot signal having a direct current (DC) value of about 1.25 during data transmission so as to easily recover the carrier wave at a receiving end. Therefore, data received from the receiver includes the DC component by the pilot signal. If a timing error component is directly detected from the received data, it is difficult to detect a correct timing error value by the influence of the DC component.

DISCLOSURE OF INVENTION

It is an object of the present invention to provide a symbol timing recovery circuit and method for demodulating a transmission signal without an error by detecting a phase error in a received data segment synchronizing signal and compensating for the detected phase error.

A symbol timing recovery circuit of a digital television embodying the present invention includes: an analog-to-digital converter for sampling a received analog signal by a symbol clock to be converted to digital data; demodulator for recovering a carrier wave, demodulating the digital data to a baseband signal and generating a segment signal; a segment synchronizing signal detector for detecting a segment synchronizing signal from the segment signal; a phase error detector activated by the segment synchronizing signal, for receiving the segment signal and detecting a phase error of synchronizing symbols of the segment synchronizing signal; and a symbol clock phase adjuster for adjusting the phase of the symbol clock according to the phase error of the synchronizing symbols to be supplied to the analog-to-digital converter as the symbol clock.

BRIEF DESCRIPTION OF DRAWINGS

For a more complete understanding of the present invention and the advantages thereof, reference is now made to the following description taken in conjunction with the accompanying drawings in which like reference numerals designate like or corresponding parts throughout the several views, and in which:

FIG. 1 is a block diagram of a symbol timing recovery circuit according to the present invention;

FIGS. 2A, 2B and 2C show variations in a segment synchronizing signal according to a symbol timing error;

BEST MODE FOR CARRYING OUT THE INVENTION

Figure 3:
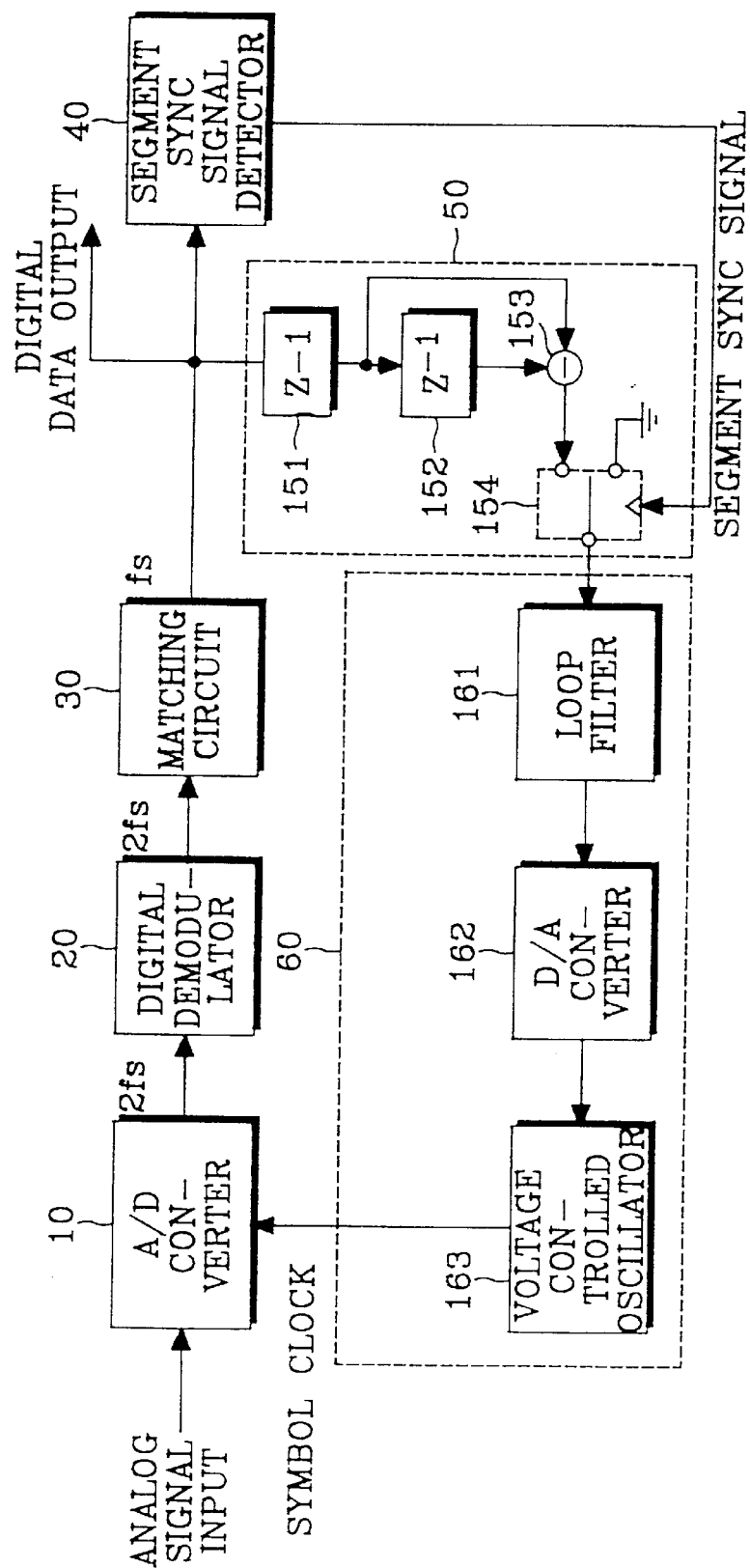
FIG. 3 is a more detailed block diagram of the symbol timing recovery circuit of FIG. 1.

In the following description, a "digital high picture quality television" indicates a high resolution television of the GA (Grand Alliance) system. A "segment signal" or a "data segment signal" is a signal of 832 symbols including data of 828 symbols and a synchronizing signal of 4 symbols and means a signal of one horizontal line. A "synchronizing signal" or a "segment synchronizing signal" represents 4 (first to fourth) synchronizing symbols for notifying the beginning of the data segment signal. The first and fourth synchronizing symbols have a signal level of +5, and the second and third synchronizing symbols have a signal level of −5.

FIG. 1 shows a symbol timing recovery circuit of a digital high picture quality television receiver. An analog-to-digital (A/D) converter 10 converts an analog signal of a select channel generated from a tuner to digital data by a symbol clock having twice a symbol rate fs. A digital demodulator 20, which is a carrier wave recovery circuit, recovers the digital data generated from the A/D converter 10 to a baseband signal which is transmission data. The digital demodulator 20 may use a digital frequency and phase locked loop (DFPLL). A matching circuit 30 is a matched filter and adjusts the symbol rate to be matched with a segment synchronizing signal detector 40. That is, data having the symbol rate of 2 fs generated from the digital demodulator 20 is adjusted to data having the symbol rate of fs through the matching circuit 30.

A segment signal generated from the matching circuit 30 is applied to a signal processor of the next stage and simultaneously supplied to the segment synchronizing signal detector 40 for detecting a synchronizing signal. The segment synchronizing signal detector 40 detects the synchronizing signal from the segment signal using the characteristics of first to fourth synchronizing symbols. A phase error detector 50 receives the segment signal and detects a phase difference between the second and third synchronizing symbols to be generated as a phase error signal. A symbol clock phase adjustor 60 adjusts the phase of the symbol clock by the phase error signal and supplies the phase-adjusted symbol clock to the A/D converter 10.

FIGS. 2A to 2C show variations in the segment synchronizing signal according to a symbol timing error. FIG. 2A illustrates the segment synchronizing signal when the symbol timing is accurately done. FIGS. 2B and 2C show the segment synchronizing signal when the symbol timing error has a positive value and a negative value, respectively.

When the symbol timing in the data segment signal is accurately done, since the second and third synchronizing symbols have almost the same shape, a previous form is maintained, as indicated in FIG. 2A. However, if various unnecessary artifacts such as channel noise or a ghost etc. are included in the course of transmission, there occurs the symbol timing error during conversion to the digital data, and the synchronizing symbols are distorted, as shown in FIGS. 2B and 2C. A distorted degree of the synchronizing signal can be calculated by a difference between the second and third synchronizing symbols. That is, the difference between the second and third synchronizing symbols corresponds to the symbol timing error. As shown in FIGS. 2B and 2C, the distorted direction of the synchronizing signal depends on whether the symbol timing error has a positive value or a negative value. The phase of the symbol clock is adjusted using a phase error which is the symbol timing error. If the phase-adjusted symbol clock is supplied to the A/D converter 10, the symbol timing error can be accurately recovered.

FIG. 3 is a more detailed block diagram of the symbol timing recovery circuit of FIG. 1. A delay 151 of the phase error detector 50 delays the segment signal generated from the matching circuit 30. Another delay 152 again delays the output of the delay 151. In this case, the delays 151 and 152 delay the segment signal received with a symbol period. A subtracter 153 calculates a phase difference between the outputs of the delays 151 and 152. A switch 154 receives the output of the subtracter 153 and generates the output of the subtracter 153 as the phase error signal when the segment synchronizing signal generated from the segment synchronizing signal detector 40 is activated. Since the segment synchronizing signal detector 40 generates the segment synchronizing signal under the state that the fourth synchronizing symbol is received, the delays 151 and 152 adjust timing so as to generate the difference between the second and third synchronizing symbols as the phase error signal. In other words, when the segment synchronizing signal detector 40 generates the segment synchronizing signal, the delays 152 and 151 generate the second and third synchronizing symbols, respectively. Therefore, when the switch 154 is switched to the subtracter 153 by the segment synchronizing signal, the subtracter 153 generates the difference signal between the second and third synchronizing symbols. Consequently, when the segment signal is received, the phase error detector 50 calculates the difference between the second and third synchronizing symbols to be generated as the phase error signal which is the symbol timing error value.

In the symbol clock phase adjustor 60 for adjusting the phase of the symbol clock by the phase error signal, a loop filter 161 accumulates the phase error signal and scales the accumulated phase error signal to a control voltage level of a voltage controlled oscillator 163. A digital-to-analog (D/A) converter 162 converts the output of the loop filter 161 to an analog voltage. The voltage controlled oscillator 163 is controlled by the voltage generated from the D/A converter 162 and adjusts the phase of the symbol clock to be supplied to the A/D converter 10 as the symbol clock.

Figure 4:
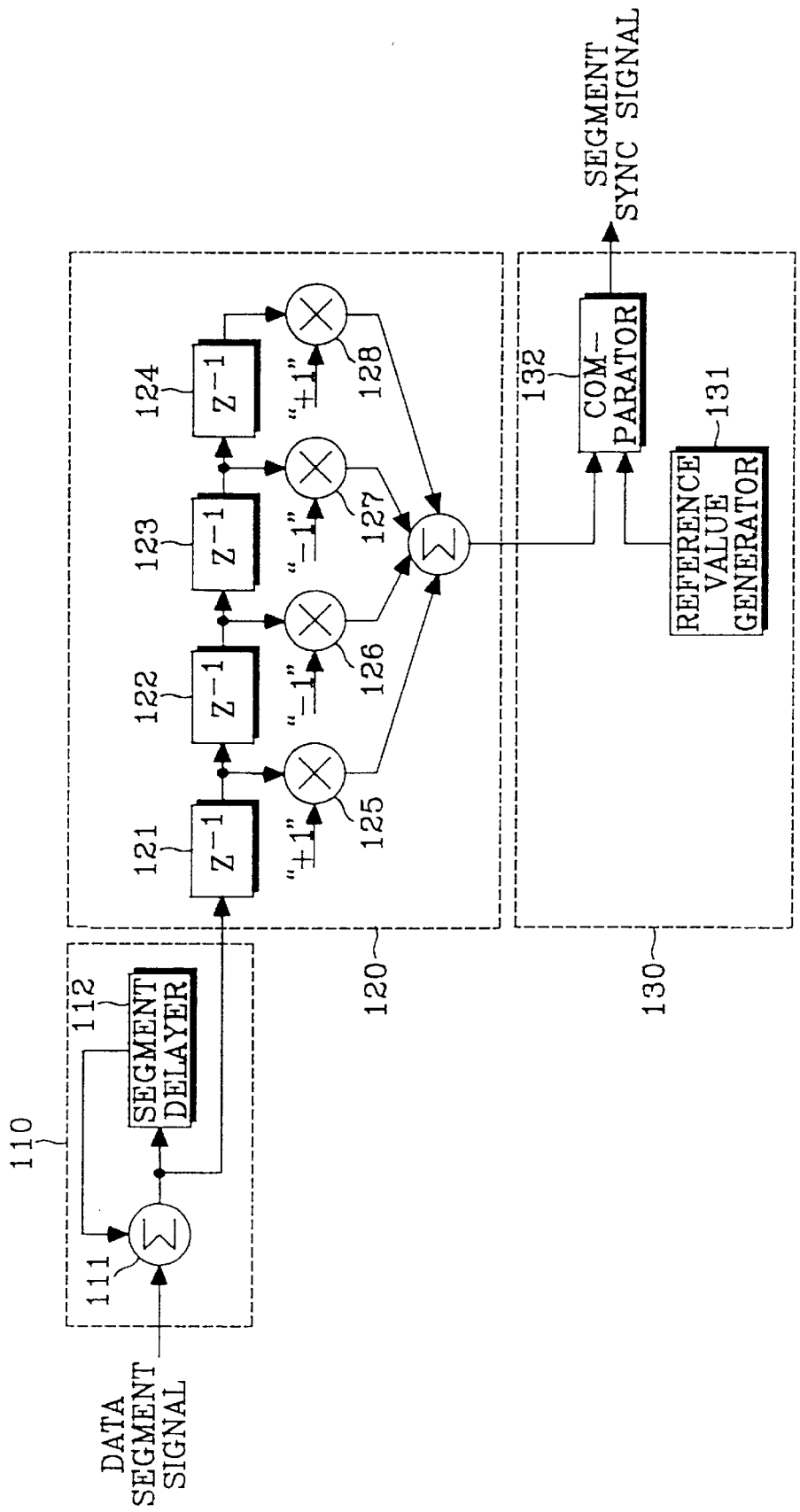
FIG. 4 is a more detailed block diagram of a segment synchronizing signal detector shown in FIGS. 1 and 3.

FIG. 4 is a more detailed block diagram of the segment synchronizing signal detector 40 shown in FIGS. 1 and 3. The segment synchronizing signal detector 40 includes a segment integrator 110, a symbol correlator 120 and a segment synchronizing signal generator 130. The segment integrator 110 delays a received data segment signal by a segment period and accumulates the delayed data segment signal. The symbol correlator 120 delays the output of the segment integrator 110 by a synchronizing signal period, multiplies each delayed synchronizing signal by a correlation value of a corresponding synchronizing signal, adds the multiplied synchronizing signals and detects the synchronizing signal having a peak value at the synchronizing signal period. The segment synchronizing signal generator 130 generates the synchronizing signal of the data segment signal by comparing the output of the symbol correlator 120 with a reference value.

An adder 111 of the segment integrator 110 sequentially adds the received data segment signal to the previous data segment signal delayed by a 1-segment period. A segment delay 112 stores the accumulated data segment signal generated from the adder 111, delays the data segment signal by a 1-segment period, and negatively feeds the delayed data segment signal back to the adder 111. Consequently, the segment integrator 110 sequentially adds the accumulated data segment signal to the currently received segment signal. The added signals are symbols of the same position of the segment period.

In the symbol correlator 120, delays 121 to 124 sequentially delay the accumulated value of each symbol generated from the adder 111 of the segment integrator 110 and generate respective delay symbol signals. Multipliers 125 to 128 respectively multiply each delay symbol signal by the correlation value of the synchronizing signal. The multipliers 125 and 128 receive a positive value of +1 so as to multiply the first and fourth synchronizing symbol signals having a positive correlation. The multipliers 126 and 127 receive a negative value of −1 so as to have a positive value by multiplying the second and third synchronizing symbol signals having a negative correlation. Hence, the multipliers 125 to 128 generate signals having the positive value at the synchronizing signal period. An adder 129 adds the outputs of the multipliers 125 to 128 and generates a synchronizing correlation signal having a peak value at the synchronizing signal period.

In the synchronizing signal generator 130, a reference value generator 131 generates a reference value which is less than an accumulated value of the synchronizing signal generated from the adder 129 and greater than an accumulated value of other random data. A comparator 132 compares the reference value with the synchronizing correlation signal generated from the adder 129 and generates the synchronizing signal when the synchronizing correlation signal is greater than the reference value.

The operation of the symbol timing recovery circuit having the above-mentioned construction will be described hereinafter.

In detecting the synchronizing signal from the segment signal, the adder 111 having one input terminal receiving the segment signal generated from the matching circuit 30 adds the output of the segment delay 112 received through the other input terminal to a currently received segment signal. Since the segment delay 112 generates the segment signal delayed by a 1-segment period, two segment signals supplied to the adder 111 is symbol data of the same position of the segment period. The added data is supplied to the segment delay 112 and simultaneously supplied to the delay 121. Therefore, it will be understood that the segment delay 112 delays the data by a 1-segment period and simultaneously stores the accumulated value of corresponding symbol data added with the segment period. Hence, the segment integrator 110 continues to accumulate the symbol data of the same position in each data segment signal. The accumulated value of the synchronizing symbol repeatedly received every segment period more increases than the accumulated value of random data symbols.

The accumulated value of the symbol is sequentially delayed by the delays 121 to 124. The delay symbol signals generated from the delays 121 to 124 are supplied to each one input terminal of the multipliers 125 to 128. The correlation values of the first to fourth synchronizing symbols are supplied to the other terminals of the multipliers 125 to 128. The first and fourth synchronizing symbols accumulated through the adder 111 have a positive value, and the second and third synchronizing symbols have a negative value. If +1, −1, −1 and +1 are supplied to the other terminals of the multipliers 125 to 128, the synchronizing symbols having a positive value are generated through the multipliers 125 to 128. During multiplication, since the synchronizing signals of 4 symbols becomes (+5)(+1), (-5)(-1), (-5)(-1) and (+5)(+1), a constant value is generated every segment period. A random data portion has a random value every segment period. The outputs of the multipliers 125 to 128 are added in the adder 129. The output of the adder 129 has a very large value at a synchronizing signal portion. At a random data portion, the output of the adder 129 has a very small value relative to the synchronizing signal portion. In the output characteristic of the accumulated correlation value generated from the adder 129, a signal having the accumulated correlation value larger than that generated at the random data portion is generated at the synchronizing signal portion. This signal is the synchronizing correlation signal.

The output of the adder 129 and the reference value generated from the reference value generator 131 are supplied to the comparator 132. The reference value is set to have a value which is smaller than the accumulated value of 4 symbols detected at the synchronizing signal portion and larger than that detected at the random data portion. If the reference value generator 131 generates such a reference value, the comparator 132 compares the reference value with the output of the adder 129. The comparator 132 generates a pulse signal of logic "high" at the synchronizing signal portion and generates a pulse signal of logic "low" at the random data portion. If the pulse signal of logic "high" generated from the comparator 132 is used as the synchronizing signal, the received data segment signal can be accurately synchronized. Therefore, the output signal of the comparator 132 is generated as the segment synchronizing signal.

Meanwhile, the data segment signal generated from the matching circuit 30 is supplied to the phase error detector 50. In operation of the phase error detector 50, the delay 151 delays the data segment signal by a symbol period. The delayed segment signal is applied to one terminal of the subtracter 153. The delayed segment signal is also supplied to the delay 152. The further delayed segment signal through the delay 152 is applied to the other terminal of the subtracter 153. The subtracter 153 calculates the different between the outputs of the delays 151 and 152. Therefore, the subtracter 153 generates a subtraction output of signals before and after one symbol with respect to all the data segment signals.

The output of the subtracter 153 is connected to a first input terminal of the switch 154. The switch 154 has a second input terminal connected to a ground terminal and a control terminal connected to the output of the segment synchronizing signal detector 40. Therefore, if the segment synchronizing signal is generated from the segment synchronizing signal detector 40, the switch 154 selects the output of the first input terminal, and if not, the switch 154 selects a ground voltage. That is, the switch 154 switches the output of the subtracter 153 only when the segment synchronizing signal is generated. The switch 154 may use a 2-input multiplexer.

The phase error value of the second and third synchronizing symbols are should be detected. The segment synchronizing signal detector 40 detects the segment synchronizing signal when the fourth synchronizing symbol is received. The phase error detector 50 adjusts a subtraction time of the second and third synchronizing symbols using the delays 151 and 152 to coincide with the time to generate the segment synchronizing signal. Hence, when the segment synchronizing signal is generated, the switch 154 generates the error value between the second and third synchronizing symbols, and this error value is the phase error value of the symbol timing.

The relationship between the second and third synchronizing symbols has a characteristic as shown in FIGS. 2A to 2C according to a transmission condition. If the symbol timing is accurate, the second and third synchronizing symbols have almost the same signal level of -5 as shown in FIG. 2A. If the symbol timing error has a positive value, the signal level of the second synchronizing symbol is larger than that of the third synchronizing symbol as indicated in FIG. 2B. If the symbol timing error has a negative value, the signal level of the third synchronizing symbol is larger than that of the second synchronizing symbol as indicated in FIG. 2C. The phase error between the synchronizing symbols is detected by the phase error detector 50 when the segment synchronizing signal is generated and supplied to the symbol clock phase adjustor 60.

In operation of the symbol clock phase adjustor 60, the loop filter 161 accumulates the symbol timing error value which is the timing phase error of the synchronizing symbol and scales an appropriate value which is capable of controlling the voltage controlled oscillator 163. The output of the loop filter 161 is converted to an analog voltage value by the D/A converter 162 and then supplied to the voltage controlled oscillator 163 as a control voltage. Since the control voltage varies with the phase error of the synchronizing symbol, the voltage controlled oscillator 163 oscillated according to the control voltage adjusts the frequency and phase of the symbol clock to gradually reduce the phase error. As a result, the phase error of the symbol clock is accurately recovered.

The above described operations are repeated until the phase error value of the synchronizing symbol detected from the phase error detector 50 approximates to 0. If the phase error value is 0, the frequency and phase of the symbol clock generated from the voltage controlled oscillator 163 are maintained.

Figure 5:
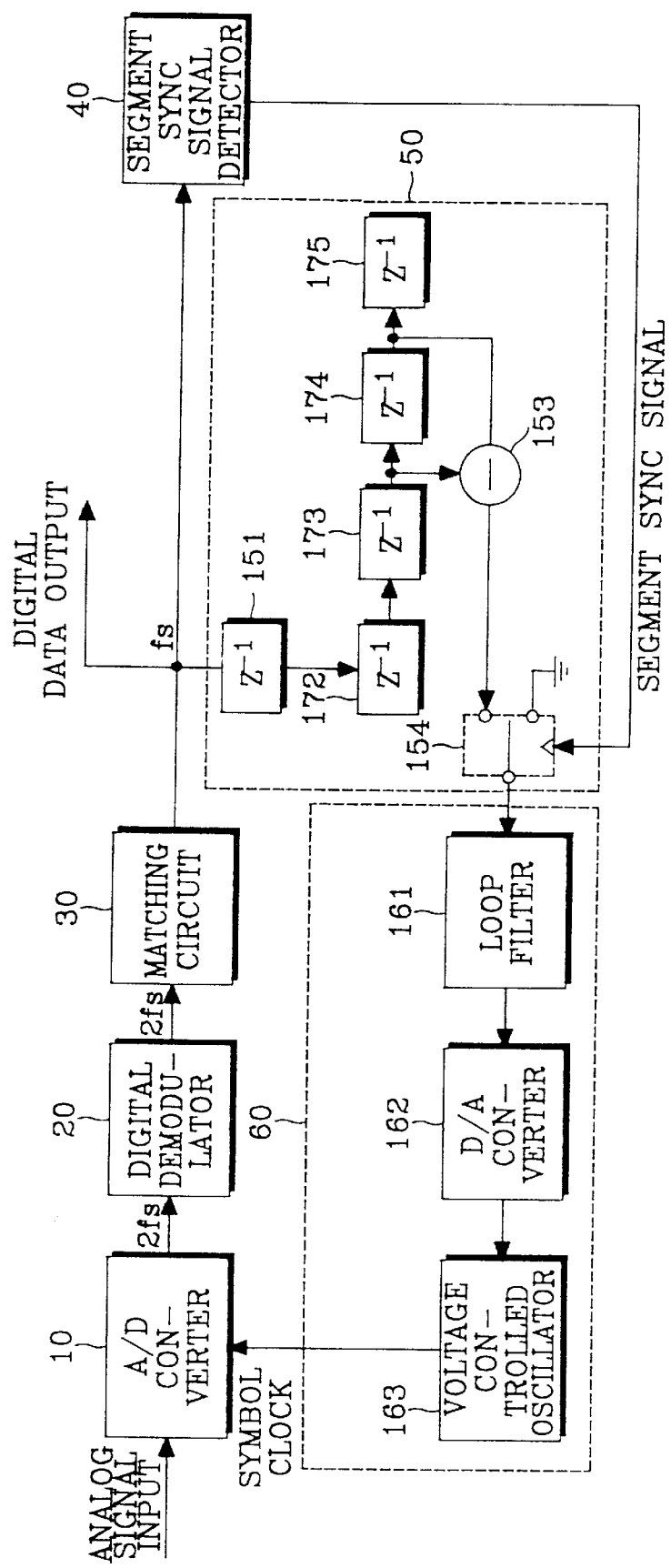
FIG. 5 is another more detailed block diagram of the symbol timing recovery circuit of FIG. 1.

FIG. 5 illustrates another embodiment of the symbol timing recovery circuit. The circuit of FIG. 5 is the same as that of FIG. 3 except the phase error detector 50. Delays 171 to 175 of the phase error detector 50 delay the symbols of the segment signal. Third and fourth delay symbols generated from the delays 173 and 174 are supplied to the subtracter 153. The delays 171 to 175 are controlled such that the time to generate the output signal of the subtracter 153 coincides with the output time of the segment synchronizing signal generated from the segment synchronizing signal detector 40. The switch 154 selectively generates the phase error value between the second and third synchronizing symbols generated from the subtracter 153 by the segment synchronizing signal.

As previously described, the phase error is directly detected using the distorted degree of the transmitted data segment synchronizing signal in a digital high picture quality television, and the frequency and phase of the symbol clock are controlled using the detected phase error value, thereby recovering the symbol timing error. Since the symbol clock recovering the timing error can accurately determine a sampling time of data at a transition time of the transmitted data segment signal, the receiver can recover data without any error.

Therefore, it should be understood that the present invention is not limited to the particular embodiment disclosed herein as the best mode contemplated for carrying out the present invention, but rather that the present invention is not limited to the specific embodiments described in this specification except as defined in the appended claims.

I claim:

1. A symbol timing recovery circuit of a digital television, comprising:

analog-to-digital converting means for sampling a received analog signal by a symbol clock to be converted to digital data;

demodulating means for recovering a carrier wave, demodulating said digital data to a baseband signal and generating a segment signal;

segment synchronizing signal detecting means for detecting a segment synchronizing signal from said segment signal;

phase error detecting means for receiving said segment signal and detecting a phase error from synchronizing symbols of said segment synchronizing signal, said phase error detecting means being activated by said segment synchronizing signal; and symbol clock phase adjusting means for adjusting the phase of said symbol clock according to said phase error of said synchronizing symbols to be supplied to said analog-to-digital converting means as said symbol clock.

2. A symbol timing recovery circuit of a digital television as set forth in claim 1, wherein said phase error detecting means comprises:

means for delaying said segment signal and again delaying the delayed segment signal to generate first and second delayed segment signals;

means for detecting a phase error of two segment signals by calculating a difference between said first and second delayed segment signals; and switching means for switching said phase error, said switching means being activated by said segment synchronizing signal.

3. A symbol timing recovery circuit of a digital television as set forth in claim 2, wherein said symbol clock phase adjusting means comprises:

a loop filter for accumulating said phase error and scaling the accumulated phase error to a control voltage level;

digital-to-analog converting means for converting an output of said loop filter to an analog control voltage; and oscillating means for adjusting the phase of said symbol clock, said oscillating means being oscillated by said analog control voltage.

4. A symbol timing recovery circuit of a digital television as set forth in any one of claims 1 to 3, wherein said segment synchronizing signal detecting means comprises:

accumulating means for delaying received data segment signals by a segment period and accumulating the delayed segment signals;

synchronizing signal correlating means for delaying an output of said accumulating means by a synchronizing signal period, multiplying each delayed synchronizing signal by a correlation value of a corresponding synchronizing signal, adding each multiplied synchronizing signal, and detecting a segment synchronizing signal having a peak value at said synchronizing signal period; and means for comparing an output of said synchronizing signal correlating means with an internal reference value to generate a segment synchronizing signal.

5. A symbol timing recovery circuit of a digital television in which one segment signal has a synchronizing signal of first to fourth symbols and data of 828 symbols, said first and fourth synchronizing symbols are transmitted with a first signal level, and said second and third synchronizing symbols are transmitted with a second signal level, said symbol timing recovery circuit comprising:

analog-to-digital converting means for sampling a received analog signal by a symbol clock to be converted to digital data;

demodulating means for recovering a carrier wave, demodulating said digital data to a baseband signal and generating a segment signal;

segment synchronizing signal detecting means for detecting a segment synchronizing signal from said segment signal;

phase error detecting means for receiving said segment signal and detecting a phase error by a difference between said second and third synchronizing symbols, said phase error detecting means being activated by said segment synchronizing signal; and symbol clock phase adjusting means for adjusting the phase of said symbol clock according to said phase error of said synchronizing symbols to be supplied to said analog-to-digital converting means as said symbol clock.

6. A symbol timing recovery circuit of a digital television as set forth in claim 5, wherein said phase error detecting means comprises:

means for delaying said segment signal and again delaying the delayed segment signal to generate first and second delayed segment signals;

means for detecting a phase error of two segment signals by calculating a difference between said first and second delayed segment signals; and switching means for switching said phase error, said switching means being activated by said segment synchronizing signal.

7. A symbol timing recovery circuit of a digital television as set forth in claim 6, wherein said symbol clock phase adjusting means comprises:

a loop filter for accumulating said phase error and scaling the accumulated phase error to a control voltage level;

digital-to-analog converting means for converting an output of said loop filter to an analog control voltage; and oscillating means for adjusting the phase of said symbol clock, said oscillating means being oscillated by said analog control voltage.

8. A symbol timing recovery circuit of a digital television as set forth in any one of claims 5 to 7, wherein said segment synchronizing signal detecting means comprises:

accumulating means having a segment delay, for adding said segment signal to the delayed segment signal generated from said segment delay;

means having first to fourth delays, for delaying an output of said accumulating means to generate first to fourth delay symbol signals;

means having first to fourth multipliers, for respectively multiplying said first to fourth delay symbol signals by a correlation value of a corresponding synchronizing signal;

adding means for adding outputs of said first to fourth multipliers and generating a peak value at a synchronizing signal period; and means for comparing an output of said adding means with an internal reference value to generate a segment synchronizing.

9. A symbol timing recovery method of a digital television in which one segment signal has a synchronizing signal of first to fourth symbols and data of 828 symbols, said first and fourth synchronizing symbols are transmitted with a first signal level, and said second and third synchronizing symbols are transmitted with a second signal level, said symbol timing recovery method comprising the steps of:

sampling a received analog signal by a symbol clock to be converted to digital data;

recovering a carrier wave, demodulating said digital data to a baseband signal and generating a segment signal;

detecting a segment synchronizing signal from said segment signal;

detecting a phase error between said second and third synchronizing symbols by said segment synchronizing signal; and adjusting the phase of said symbol clock according to said phase error of said synchronizing symbols and supplying the phase-adjusted symbol clock to said sampling step.

* * * * *